(12) United States Patent
Murtojärvi

(10) Patent No.: US 6,259,312 B1
(45) Date of Patent: *Jul. 10, 2001

(54) CIRCUIT ARRANGEMENT FOR ADJUSTING THE IMPEDANCE OF A DIFFERENTIAL ACTIVE COMPONENT

(75) Inventor: Simo Murtojärvi, Salo (FI)

(73) Assignee: Nokia Mobile Phones Limited, Espoo (FI)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/265,165

(22) Filed: Mar. 9, 1999

(30) Foreign Application Priority Data

Mar. 11, 1998 (FI) .......................................... 980546

(51) Int. Cl.[7] ............................................. G06G 7/12
(52) U.S. Cl. ........................ 327/563; 327/308; 330/252
(58) Field of Search .................... 327/560, 561, 327/562, 563, 306, 308, 309, 310–313, 315, 316; 330/252, 253, 254, 259, 260, 291, 292

(56) References Cited

U.S. PATENT DOCUMENTS

| | | | |
|---|---|---|---|
| 4,146,844 | * 3/1979 | Quinn | 330/149 |
| 4,476,440 | 10/1984 | Bennett, Jr. | 330/260 |
| 4,517,524 | 5/1985 | Davis | 330/257 |
| 4,774,475 | * 9/1988 | LaVoie | 330/149 |
| 4,902,984 | * 2/1990 | Vinn et al. | 330/252 |
| 5,241,284 | 8/1993 | Nyqvist et al. | 330/297 |
| 5,399,988 | * 3/1995 | Knierim | 330/149 |
| 5,493,250 | * 2/1996 | Kasperkovitz et al. | 327/563 |
| 5,565,821 | 10/1996 | Murtojarvi | 331/117 D |
| 5,734,294 | * 3/1998 | Bezzam et al. | 327/552 |
| 5,877,643 | * 3/1999 | Drogi | 327/256 |
| 6,100,758 | * 8/2000 | Klemmer | 330/252 |

FOREIGN PATENT DOCUMENTS

| | | |
|---|---|---|
| 0473365A3 | 3/1992 | (EP) . |
| 0587265A1 | 3/1994 | (EP) . |

OTHER PUBLICATIONS

"Design Aspects of 10 to 40 Gb/s Digital and Analog Si–Bipolar ICs", H. M. Rein, 1995 Symposium on VLSI Circuits Digest of Technical Papers, pp. 49–54.

"RF Circuits for Communication Applications", Andrezyk et al, RF Design, vol. 19, No. 1, Jan. 1996, pp. 74–80.

* cited by examiner

Primary Examiner—Kenneth B. Wells
Assistant Examiner—Hai L. Nguyen
(74) Attorney, Agent, or Firm—Perman & Green, LLP

(57) ABSTRACT

The active component (400, 500) of a radio device comprises a first transistor (Q1) and a second transistor (Q2). The differential input of the active component comprises a first input line (RF+) and a second input line (RF−), of which the first input line is coupled to the base of the first transistor (Q1) and the second input line is coupled to the base of the second transistor (Q2). In order to match the input impedance there is cross-feedback (Rfb') between the first transistor (Q1) and the second transistor (Q2).

10 Claims, 5 Drawing Sheets

CIRCUIT ARRANGEMENT FOR ADJUSTING THE IMPEDANCE OF A DIFFERENTIAL ACTIVE COMPONENT

TECHNOLOGICAL FIELD

The invention relates to the adjustment of the input impedance of such active components which have a differential input. Typical such active components are some amplifiers and mixers which are used in the radio frequency and intermediate frequency sections of a radio device.

BACKGROUND OF THE INVENTION

Particularly in integrated circuit structures the active components of radio devices, such as amplifiers and mixers, are often realized as differential components, which means that the active component has two inputs and two outputs, whereby the input signal is a variable voltage between the two inputs and the output signal is a variable voltage between the two outputs. An alternative to the differential component is a single input and single output component where the input signal is a variable voltage between the input and a fixed ground potential, and the output signal is a variable voltage between the output and a fixed ground potential. An advantage of the differential structure is particularly that there is less variations in the component's performance caused by the manufacturing process. In the signal propagation direction there can be for instance a balun circuit, an amplifier, a filter or a mixer in front of the differential active component.

FIG. 1 shows a typical prior art differential amplifier 100, which has inputs RF+ and RF− provided with decoupling capacitors, and outputs OUT1 and OUT2. Two transistors Q1 and Q2 act as the amplifying components; the positive operating voltage Vcc is supplied to their collectors via the collector resistors RC and their emitters are connected via the emitter resistors RE and a constant current source Idiff to the ground potential. In addition to the input signal also a bias voltage Vb is supplied to both transistor bases via the biasing resistors Rb in order to bias the transistors Q1 and Q2 to the correct operating point. The output signal is taken at the collectors of the transistors Q1 and Q2.

In the operation of an amplifier according to the FIG. 1 a problem is created by its input impedance. In the signal propagation direction there is most commonly a filter (not shown in the figure) in front of the amplifier, whereby the filter can directly have a differential output, or its non-differential output can be duplicated with a so called balun before it is connected to the inputs of the amplifier. The frequency response of the filter depends on the input impedance of that component to which the signal is supplied from the filter. The input impedance of the amplifier shown in figure is as such very high, i.e. of the order of megaohms. In order to have a correct function of the circuit arrangement formed by the filter and the amplifier in series with it the input impedance of the amplifier must be adjusted to a value, which is a few tens or at most hundreds of ohms. 50 ohm has become a kind of a standard value for the impedances between RF components, but depending on the details of the filter structure a suitable value of the input impedance can also be for instance 100 or 200 ohms.

A simple way to adjust the input impedance of the amplifier according to FIG. 1 as 200 ohms is to select 100 ohms as the value of both biasing resistors Rb. Another common way to arrange the input impedance of the amplifier according to the FIG. 1 is that a resistor with a resistance equalling the desired input impedance is connected between the inputs RF+ and RF−. A disadvantage of these solutions is that they impair the noise characteristics of the amplifier.

FIG. 2 shows a more advanced solution, the so called collector feedback. In this solution the signal taken from the collectors of both amplifier transistors Q1 and Q2 is supplied to the bases of the additional transistors Q3 and Q4, and the signal to the amplifier outputs OUT1 and OUT2 is taken at the emitters of the transistors Q3 and Q4. The transistors Q3 and Q4 are supplied with the operating voltage from the common operating voltage source Vcc, and the emitters of both transistors are connected via an own constant current source Idiff3 and Idiff4 to the ground potential. From the emitter of the transistor Q3 there is a connection via the feedback resistor Rfb and a decoupling capacitor to the base of the transistor Q2, and from the emitter of the transistor Q4 there is a similar connection to the base of the transistor Q1. The input impedance can be affected by selecting the values of the feedback resistors Rfb in a suitable way. The circuit arrangement according to the FIG. 2 has generally a high gain and relatively good noise characteristics, but a poor reverse isolation. The last mentioned disadvantageous characteristic means that if undesired oscillations are coupled to the output of the amplifier, for instance from a mixer (not shown in the figure) in series with the amplifier, these oscillations will propagate relatively easily through the amplifier in a direction opposite to that of the signal, and thus these oscillations can be coupled from the input of the amplifier to other parts of the radio device causing interference there (for instance in the antenna).

FIG. 3 shows another prior art way to adjust the input impedance of an amplifier. The circuit arrangement is in other respects similar to that of FIG. 1, but the input signal is not supplied from the inputs RF+ and RF− to the bases of the transistors Q1 and Q2 but to the emitters, and the bases of the transistors Q1 and Q2 are interconnected, whereby the biasing can be made with one biasing resistor Rb. Regarding the radio frequencies the bases of the transistors Q1 and Q2 are connected via the decoupling capacitor to the ground potential. The input impedance is mainly determined by the value of the series resistances Rin. The circuit according to the FIG. 3 is suited only for very low values of the input impedances, because its gain G will always be lower than the ratio of the collector resistances RC to the serial resistances Rin, or G<RC/Rin. At greater values of the input impedance the circuit arrangement according to the FIG. 3 does not sufficiently amplify the signal.

SUMMARY OF THE INVENTION

The object of the invention is to present a circuit arrangement with which a desired input impedance of a differential active component is obtained without simultaneously impairing other characteristics, such as the reverse isolation, the gain, the noise characteristics and the power consumption.

The objects of the invention are attained by forming a cross-feedback between the transistors of the differential transistor pair.

The differential active component according to the invention, which comprises a first transistor and a second transistor and whose differential input comprises a first input and a second input, of which the first input is connected to the base of the first transistor and the second input is connected to the base of the second transistor, is characterized in that there is a cross-feedback between the first transistor and the second transistor.

The invention relates also to a radio device which comprises at least one differential active component and a second component in front of it as seen in the signal propagation direction, whereby the differential output of the second component has a certain output impedance. The radio device according to the invention is characterized in that in order to match the output impedance of the differential active component so that it corresponds to the output impedance of the component in front of it, as seen in the signal propagation direction, there is a cross-feedback between the first transistor and the second transistor contained in the differential active component.

The invention utilizes the fact that at the first transistor of the differential transistor pair the signal is in the opposite phase compared to that in the second transistor. The base of the first transistor in the differential transistor pair is connected via a feedback resistor to the emitter of the second transistor, and the base of the second transistor is correspondingly connected via a feedback resistor to the emitter of the first transistor. The values of the feedback resistors determine the input impedance of the circuit arrangement. A high gain is obtained, because it will not depend on the same resistance values as the input impedance, but it can be selected with the aid of the values of the collector and emitter resistors in the differential transistor pair. Regarding the noise characteristics it is advantageous in the invention that the current passing through the input impedance matching resistors at the signal frequency is added to the output and will not be lost in the matching resistor as in such solutions where the matching resistor is connected directly between the inputs. The reverse isolation is good, because there is no shortcut between the output and the input similar to that of the solution shown in FIG. 2.

BRIEF DESCRIPTION OF THE DRAWINGS

The invention is described in more detail below with reference to the preferred embodiments presented as examples and to the enclosed figures, in which.

Above we referred to the FIGS. 1 to 3 in connection with the description of prior art, so that below in the description of the invention and its preferred embodiments reference is made mainly to the FIGS. 4 to 6. The same reference numerals are used for corresponding components in the figures.

DETAILED DESCRIPTION OF THE INVENTION

Figure 1:
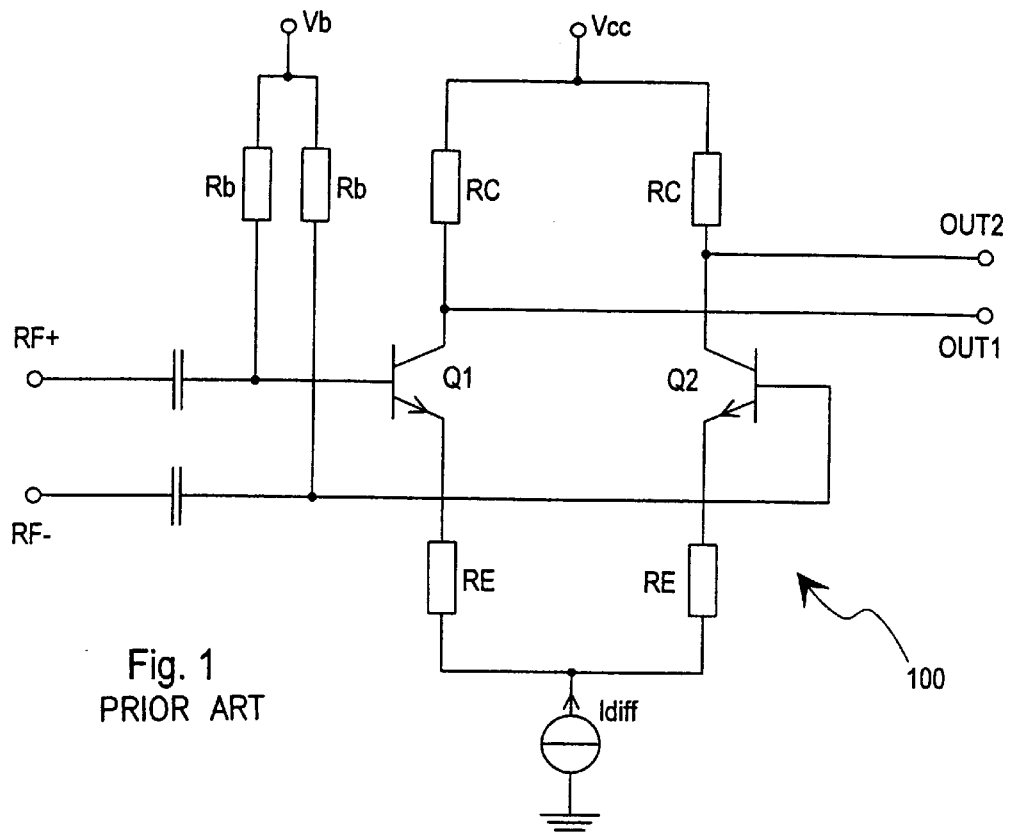
FIG. 1 shows the basic circuit arrangement of a differential amplifier.
Figure 4:
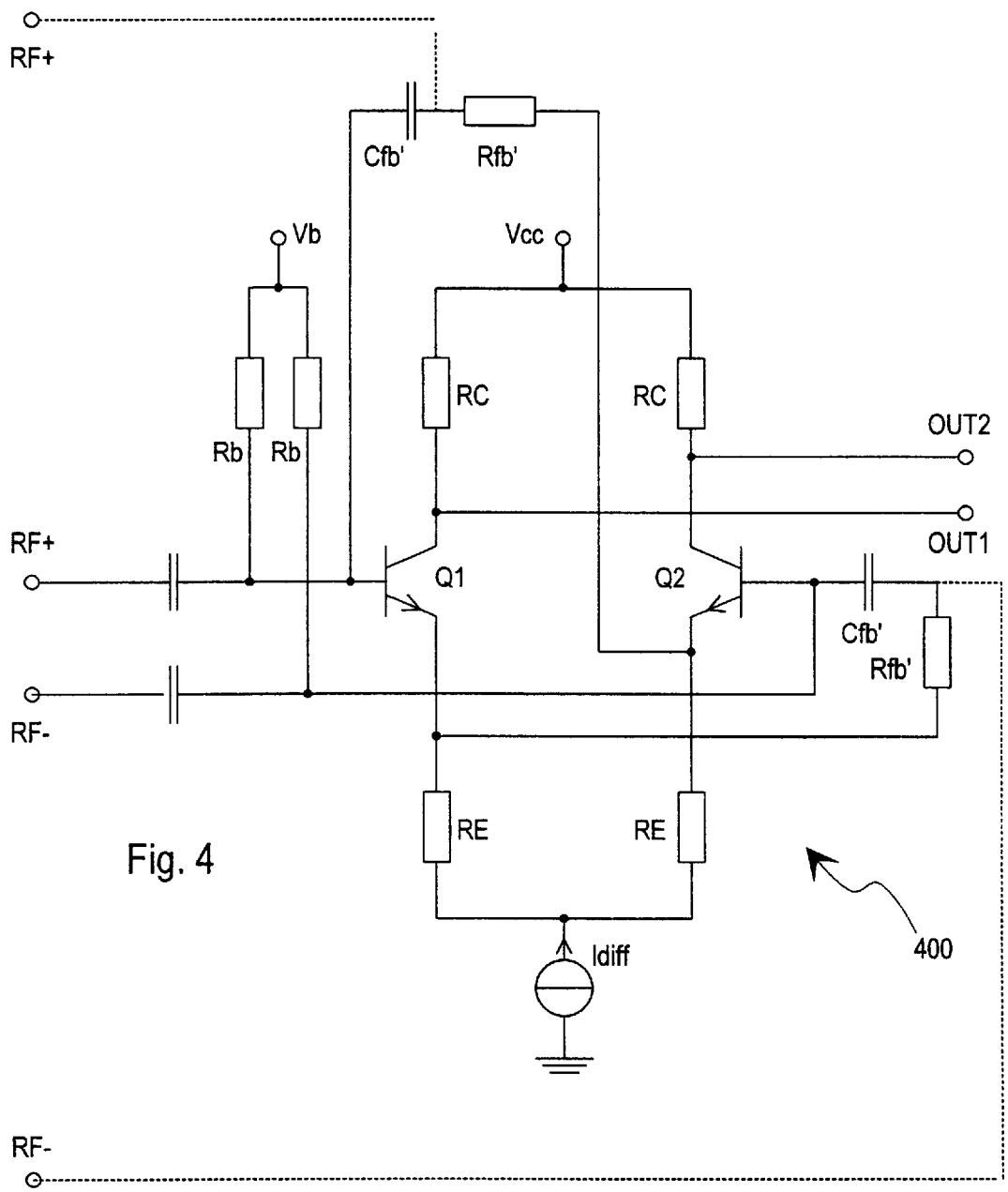
FIG. 4 shows an amplifier according to the invention.

FIG. 4 shows a differential amplifier 400, in which some components are similar to those of the prior alt amplifier 100 shown in FIG. 1. The amplifier 400 has inputs RF+ and RF− provided with decoupling capacitors, and outputs OUT1 and OUT2. Two transistors Q1 and Q2 act as the amplifying components, and the positive operating voltage Vcc is supplied to their collectors via the collector resistors RC and their emitters are connected to the ground potential through the emitter resistors RE and a constant current source Idiff. In this case, as also in other circuit arrangements presented in this patent application, the transistors Q1 and Q2 can be bipolar transistors, field effect transistors or FETs, GaAs-FETs (Gallium Arsenide FET), HBTs (Heterojunction Effect Transistor), HEMTs (High Electron Mobility Transistor) or corresponding transistors or their Darlington pairs. In addition to the input signal also a biasing voltage Vb is supplied via the biasing resistors Rb to the bases of both transistors Q1 and Q2 in order to bias the transistors to the correct operating point. The output signal is taken at the collectors of the transistors Q1 and Q2.

Figure 3:
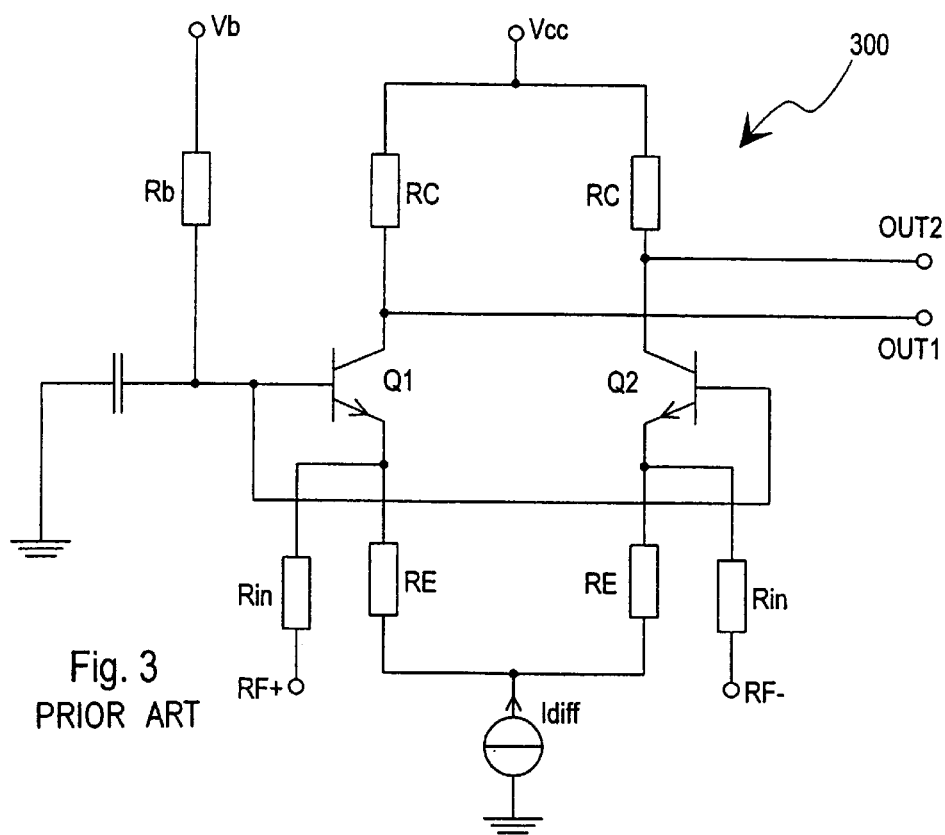
FIG. 3 shows another known way to adjust the input impedance.
Figure 2:
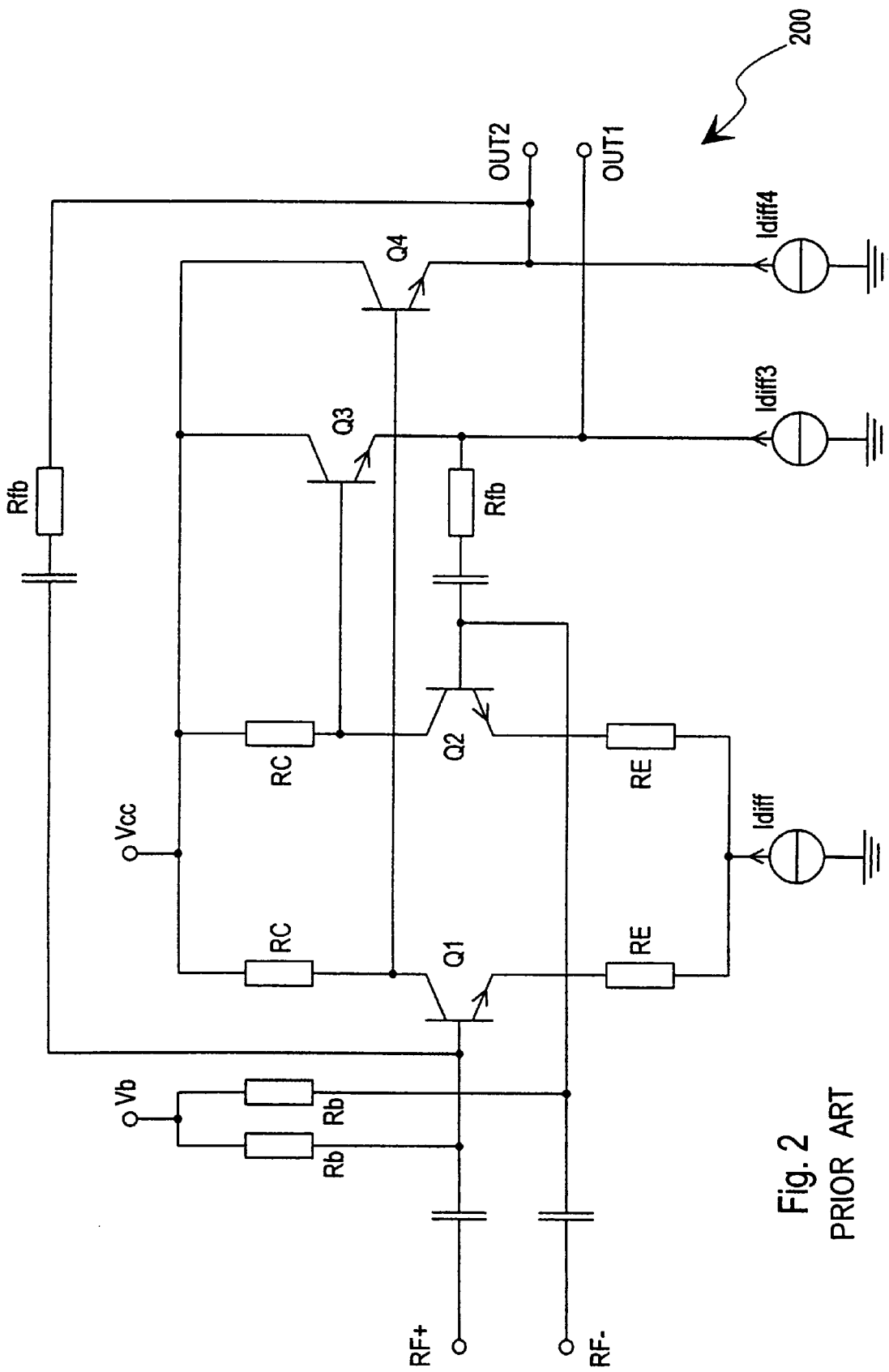
FIG. 2 shows a known way to adjust the input impedance.

According to the invention the emitter of the transistor Q1 is connected through the feedback resistor Rfb' and the decoupling capacitor Cfb' to the base of the transistor Q2, and correspondingly the emitter of the transistor Q2 is coupled through the feedback resistor Rfb' and the decoupling capacitor Cfb' to the base of the transistor Q1. Regarding the input impedance the feedback resistors Rfb' are located in the same way as the series resistors Rin in the solution presented in FIG. 3. However, there is a phase difference of 180 degrees between the signals seen by the first and second transistors in the differential transistor pair, so that in order to obtain the same input impedance the resistors Rfb' in the circuit arrangement shown in FIG. 4 must have the double value compared to the value of the resistors Rin shown in FIG. 3 (in FIG. 4 there is "virtual ground" at the middle point between the two resistors Rfb'). The gain of the differential amplifier shown in FIG. 4 is determined by the ratio RC/RE. Regarding the noise performance it is advantageous that the current with the signal frequency flowing through the resistors Rfb' is added to the output of the amplifier. Regarding the reverse isolation the circuit arrangement presented in the FIG. 4 is of the same order as the known circuit arrangement shown in FIG. 1.

To a person skilled in the art it is obvious that in the circuit arrangement according to FIG. 4 the inputs can also be connected between the feedback resistor Rfb' and the decoupling capacitor Cfb', which in FIG. 4 is shown by the broken lines. At the signal frequency the decoupling capacitor virtually represents a short circuit, so that regarding the signal the point between the feedback resistor Rfb' and the decoupling capacitor Cfb' is equal to the base of the transistor. Decoupling capacitors are not required at the inputs, if the component connected to the inputs is floating regarding the direct current and if it is at a suitable potential regarding the biasing; in the latter case also the biasing resistors Rb are unnecessary.

In the circuit arrangement shown in FIG. 4 a desired combination of the gain, the noise performance and the input impedance is obtained by selecting suitable values for the resistances RC, RE and Rfb' and suitable magnitudes for the current of the constant current source Idiff, for the operating voltage Vcc and for the biasing voltage Vb, for instance by experiments. The decoupling capacitors connected in series with the resistors Rfb' are not necessary, if it is possible to have a correct biasing for the transistors Q1 and Q2 in some other way. Instead of the resistors Rfb' it is possible to use other components with an impedance comprising substantially only a resistance at the used frequencies. An inductive or capacitive reactance in the feedback between the differential transistor pair would cause the amplifier input impedance to be strongly frequency dependent.

Figure 5:
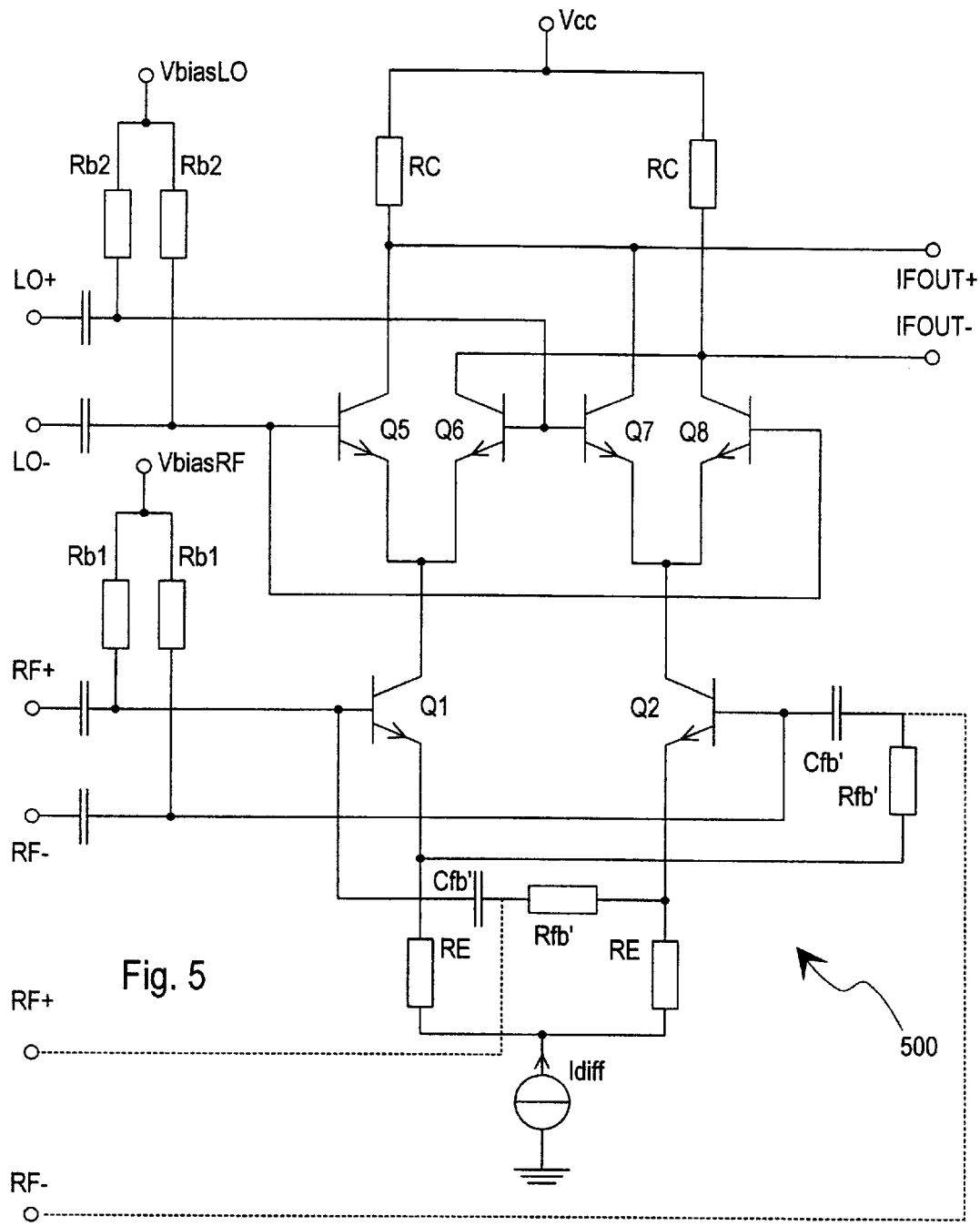
FIG. 5 shows a mixer according to the invention.

FIG. 5 shows a mixer 500 according to the invention which is intended to mix a radio frequency signal to the intermediate frequency. The bottom part of the figure has a circuit topology which resembles the amplifier according to the invention. A radio frequency signal is supplied via the inputs RF+ and RF− to the bases of the transistors Q1 and Q2, and via the cross-feedbacks Rfb' according to the invention also to the emitters of the transistors which are connected to the ground potential by the constant current source Idiff. The biasing of the transistors Q1 and Q2 is made in the usual way with the biasing voltage VbiasRF through the resistors Rb1. The collectors of both transistors Q1 and Q2 are connected to the emitters of their own differential transistor pairs Q5/Q6 and Q7/Q8. The local oscillator signal is supplied via the inputs LO+ and LO− and via the decoupling capacitors, which are connected to the inputs, to the bases of the differential transistor pairs, so that the input LO+ is connected to the bases of the transistors Q6 and Q7 and the input LO− is connected to the bases of the transistors Q5 and Q8. The biasing of the differential transistor pairs is made with the biasing voltage VbiasLO through the resistors Rb2. The operating voltage Vcc is supplied through the resistors RC to the collectors of all transistors Q5−Q8. The output signal is supplied to the outputs IFOUT+ and IFOUT− so that the signal to the output IFOUT+ is taken at the collectors of the transistors Q5 and Q7 and the output IFOUT− is taken at the collectors of the transistors Q6 and Q8.

In the mixer shown in FIG. 5 the input impedance of the differential RF input is according to the invention determined by the values of the resistors Rfb' in the same way as the input impedance of the amplifier according to the invention shown in FIG. 4. The inputs can also be connected between the feedback resistors Rfb' and the decoupling capacitors Cfb' connected to them, which is shown by the broken lines.

Figure 6:
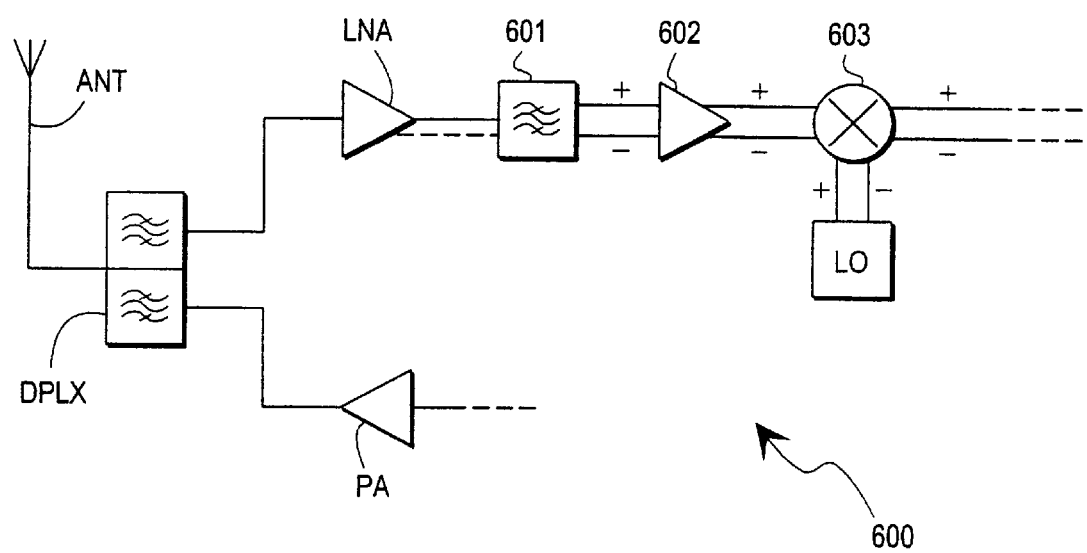
FIG. 6 shows an example of the location of the invention in a radio device.

FIG. 6 shows a part of a radio device with an antenna ANT and a duplex filter DPLX connected to it, whereby the filter functions to direct the signals received by the antenna at the reception frequency to the receive branch of the radio device, and the transmission frequency signals generated by the transmit branch of the radio device to the antenna. The transmit branch of the radio device can be according to the prior art, and in the figure it is represented only by the power amplifier PA, whereby the broken line from the right represents all known other parts of the transmit branch of the radio device. In the receive branch the first component is a low noise amplifier LNA, which in the embodiment shown in the figure is a prior art amplifier known per se. Its output can be a single-pole or a differential output, which in the figure is represented by a second connection drawn in a broken line to the filter after the LNA. In the figure it is assumed that the output of the filter 601 is differential, whereby the amplifier 602 after the filter can be an amplifier according to the invention. In the same way the mixer 603 can be a mixer according to the invention, with which the radio frequency signal propagating in the receive branch is mixed to the intermediate frequency determined by the local oscillator LO. The intermediate frequency signal from the mixer 603 is supplied to the other parts known per se of the receive branch of the radio device, which in the figure is represented by the broken lines continuing to the right.

The FIG. 6 does not limit the application of the invention in a radio device, but the invention can also be applied in other parts of a radio device where a certain active component has a differential input. Thanks to the invention there is no need to use separate impedance matching circuit arrangements in the radio device between the differential active component and the component in front of it, which saves space and manufacturing costs. Further, thanks to the invention, the noise performance of the radio device is better and the power consumption is lower than in prior art radio devices.

What is claimed is:

1. An active component of a radio device, comprising:
    a first transistor and a second transistor,
    a differential input with a first input line and a second input line, of which the first input line is coupled to the base of the first transistor and the second input line is coupled to the base of the second transistor, said differential input having an input impedance; and
    a cross-feedback connection between the first transistor and the second transistor, said connection further comprising:
        a first connection through a first feedback RC circuit from the emitter of said first transistor to the base of said second transistor and a second connection through a second feedback RC circuit from the emitter of said second transistor to the base of said first transistor, wherein the value of said input impedance is directly determined by the characteristics of said cross-feedback connection.

2. An active component according to claim 1, wherein the emitter of the first transistor is coupled to the base of the second transistor, and the emitter of the second transistor is coupled to the base of the first transistor.

3. An active component according to claim 2, wherein the coupling between the emitter of the first transistor and the base of the second transistor comprises a first resistor, and the coupling between the emitter of the second transistor and the base of the first transistor comprises a second resistor with a resistance equalling the resistance of the first resistor.

4. An active component according to claim 3, wherein the coupling between the emitter of the first transistor and the base of the second transistor further comprises a first capacitor which is connected in series with the first resistor, and the coupling between the emitter of the second transistor and the base of the first transistor further comprises a second capacitor which is connected in series with the second resistor.

5. An active component according to claim 1, characterized in that it is an amplifier.

6. An active component according to claim 1, characterized in that it is a mixer.

7. A radio device comprising:
    a differential active component with a first transistor and a second transistor,
    a differential input to the differential active component with a certain input impedance, a first input line and a second input line, of which the first input line is coupled to the base of the first transistor and the second input line is coupled to the base of the second transistor,
    an other component in front of the differential active component in the signal propagation direction,
    a differential output from the other component with a certain output impedance, and
    a cross-feedback connection between the first transistor and the second transistor in the differential active component, said connection further comprising:
        a first connection through a first feedback RC circuit from the emitter of said first transistor to the base of said second transistor and a second connection through a second feedback RC circuit from the emitter of said second transistor to the base of said first transistor, wherein the value of said input impedance is directly determined by the characteristics of said cross-feedback connection, in order to match the input impedance of the differential input so that it corresponds to the output impedance of the differential output.

8. A radio device according to claim 7, wherein order to form the cross-feedback the emitter of the first transistor is coupled to the base of the second transistor and the emitter of the second transistor is coupled to the base of the first transistor.

9. A radio device according to claim 7, wherein the differential active component is an amplifier and the component in front of it in the signal propagation direction is a filter.

10. A radio device according to claim 7, wherein the differential active component is a mixer and the component in front of it in the signal propagation direction is an amplifier.

* * * * *